United States Patent
Walldorf et al.

(10) Patent No.: US 10,403,995 B2
(45) Date of Patent: Sep. 3, 2019

(54) ELECTRICAL CONNECTOR, ELECTRONIC COMPONENT, AND ASSEMBLY METHOD

(71) Applicant: TE Connectivity Germany GmbH, Bensheim (DE)

(72) Inventors: Daniel Walldorf, Hattersheim (DE); Calogero Mauro Buscemi, Freiburg im Breisgau (DE); Markus Strelow, Morlenbach (DE); Chistian Schrettlinger, Bensheim-Auerbach (DE); Frank Wolf, Rodgau-Juegesheim (DE); Steffen Burger, Frankfurt am Main (DE); Chris Buechling, Nierstein (DE); Mike Laub, Enola, PA (US); Ulrich Buchmann, Eppertshausen (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 15/703,159

(22) Filed: Sep. 13, 2017

(65) Prior Publication Data

US 2018/0006390 A1 Jan. 4, 2018

Related U.S. Application Data

(63) Continuation of application No. PCT/EP2016/055382, filed on Mar. 11, 2016.

(30) Foreign Application Priority Data

Mar. 13, 2015 (EP) .................................... 15158971

(51) Int. Cl.
*H01R 12/75* (2011.01)
*H01R 13/514* (2006.01)
(Continued)

(52) U.S. Cl.
CPC ............. *H01R 12/75* (2013.01); *H01R 12/53* (2013.01); *H01R 12/707* (2013.01); *H01R 13/41* (2013.01);
(Continued)

(58) Field of Classification Search
CPC ................ H01R 12/716; H01R 12/724; H01R 13/5213; H01R 13/6658; H05K 1/144; H05K 5/006; H05K 2201/0954
(Continued)

(56) References Cited

U.S. PATENT DOCUMENTS 4,047,242 A * 9/1977 Jakob ................... H05K 7/1417
361/709
6,149,469 A 11/2000 Kim
(Continued)

FOREIGN PATENT DOCUMENTS

CN 1496003 A 5/2004
CN 201805112 U 4/2011
(Continued)

OTHER PUBLICATIONS

Notification, PCT International Search Report and Written Opinion, dated Jun. 10, 2016, 11 pages.
(Continued)

*Primary Examiner* — Hien D Vu
(74) *Attorney, Agent, or Firm* — Barley Snyder

(57) ABSTRACT

An electrical connector comprises an interface element attachable to a circuit board and a plurality of peripheral connectors. The interface element has an inner contact electrically contacting the circuit board and a connecting interface. The peripheral connectors are each individually matable with the connecting interface. The peripheral con-
(Continued)

nectors include a peripheral plug connector having a plurality of plug connector pins and a peripheral lead connector having a plurality of wires.

12 Claims, 16 Drawing Sheets

(51) Int. Cl.
| | |
|---|---|
| *H01R 13/66* | (2006.01) |
| *H03K 17/95* | (2006.01) |
| *H01R 12/53* | (2011.01) |
| *H01R 12/70* | (2011.01) |
| *H01R 13/41* | (2006.01) |
| *H01R 43/20* | (2006.01) |
| *H01R 13/627* | (2006.01) |

(52) U.S. Cl.
CPC ....... *H01R 13/514* (2013.01); *H01R 13/6683* (2013.01); *H01R 43/205* (2013.01); *H03K 17/9505* (2013.01); *H01R 13/6273* (2013.01)

(58) Field of Classification Search
USPC ................................. 361/736, 752; 439/76.1
See application file for complete search history.

(56) References Cited

U.S. PATENT DOCUMENTS

| 6,906,527 | B1 | 6/2005 | Niimi et al. | |
|---|---|---|---|---|
| 7,967,617 | B2 * | 6/2011 | Vonnegut | H01R 13/6658 |
| | | | | 439/142 |
| 8,292,670 | B2 * | 10/2012 | Kreider | H01R 31/065 |
| | | | | 439/638 |
| 8,727,795 | B2 * | 5/2014 | Feyder | H01R 12/732 |
| | | | | 439/76.1 |
| 9,419,391 | B2 * | 8/2016 | Bolouri-Saransar | H01R 4/24 |
| 2008/0188138 | A1 | 8/2008 | Carroll et al. | |
| 2015/0056824 | A1 | 2/2015 | Bolouri-Saransar et al. | |

FOREIGN PATENT DOCUMENTS

| CN | 102437491 A | 5/2012 |
|---|---|---|
| EP | 1398878 A2 | 3/2004 |
| GB | 2511389 A | 9/2014 |
| JP | H03-058839 U | 6/1991 |
| JP | 2004-111116 A | 4/2004 |
| JP | 2007-066592 A | 3/2007 |

OTHER PUBLICATIONS

Dixon D., et al., "The Inductive Prox: An Old Sensor With New Wrinkles", Control Solutions, Pennwell Publishing, Tulsa, OK, US, vol. 62, No. 10, Oct. 31, 1989, pp. 55-58, 4 pages, XP 000072564, ISSN: 1074-2328.
Chinese First Office Action with English translation, Chinese Patent Application No. 201380015513.7, dated Nov. 30, 2018, 18 pages.
Abstract of CN 201805112 U, dated Apr. 20, 2011, 1 page.
Japanese Notice of Reasons for Refusal with English translation, dated Sep. 25, 2018, 8 pages.
Abstract of JP 2007-066592A, dated Mar. 15, 2007, 1 page.
Abstract of CN 102437491 A, dated May 2, 2012, 1 page.

* cited by examiner

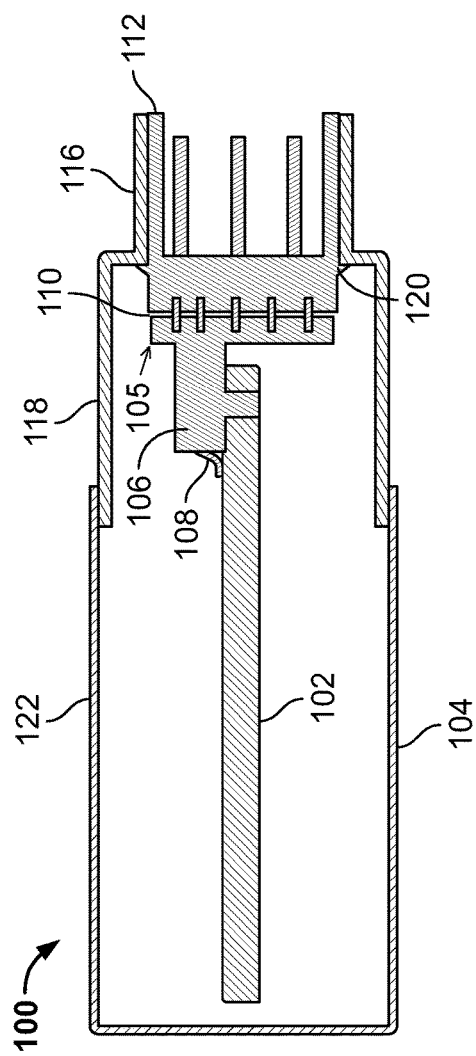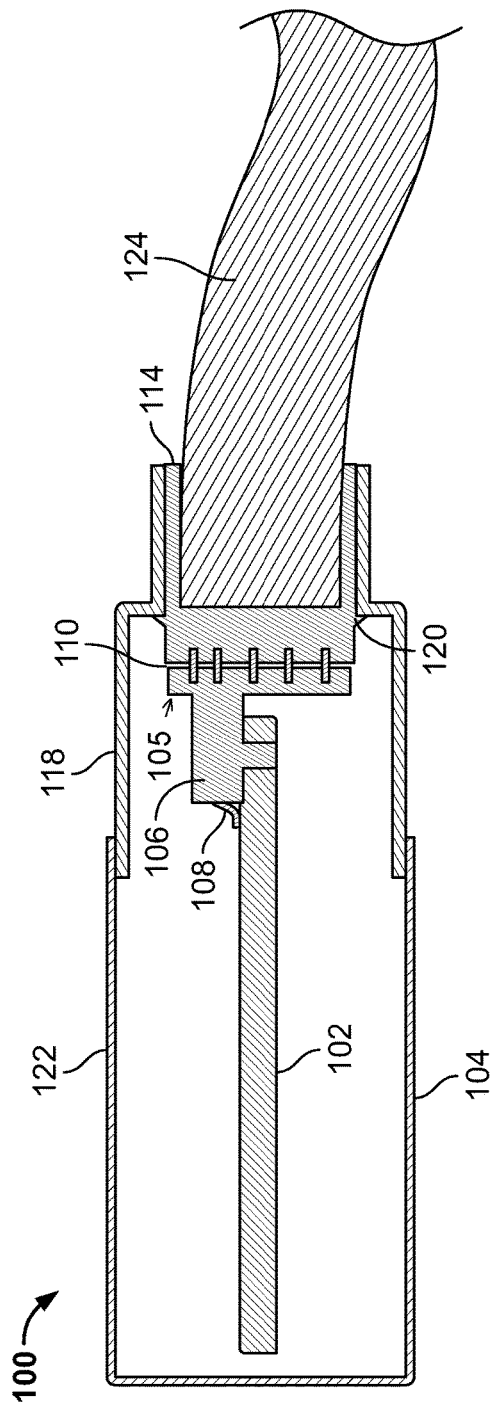
Fig. 1
Fig. 2

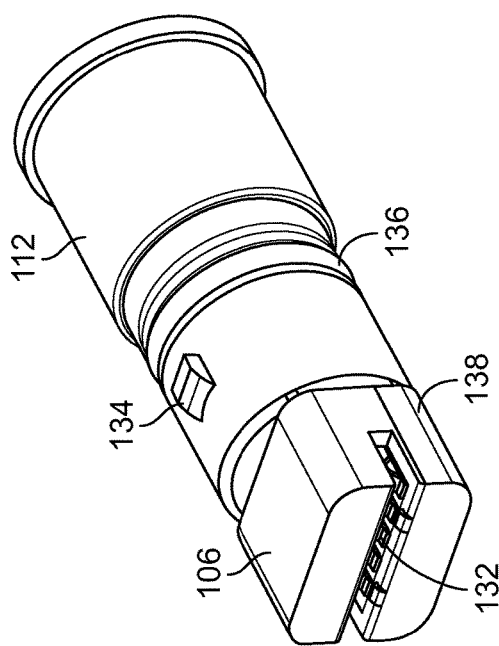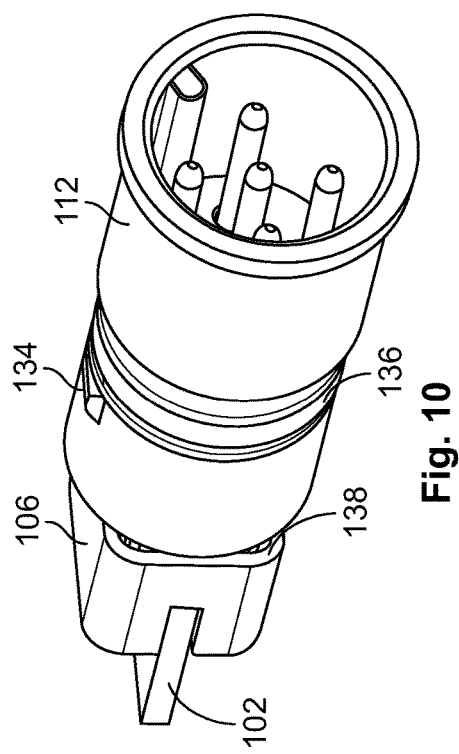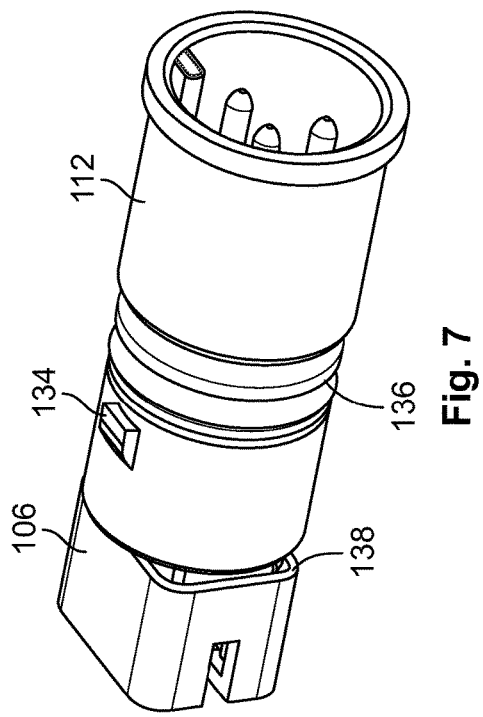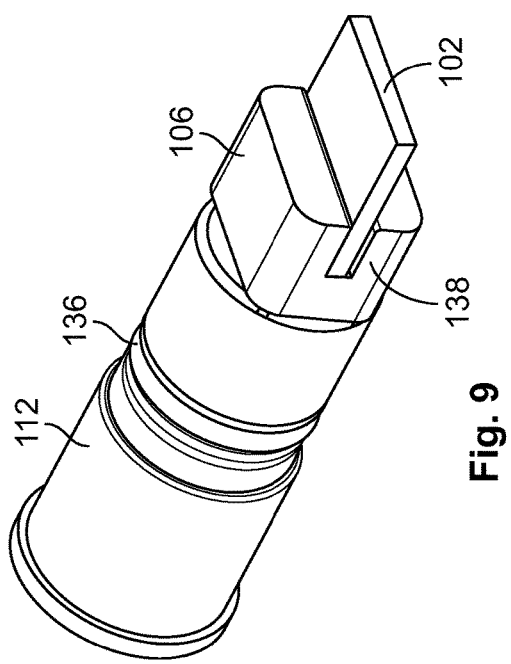

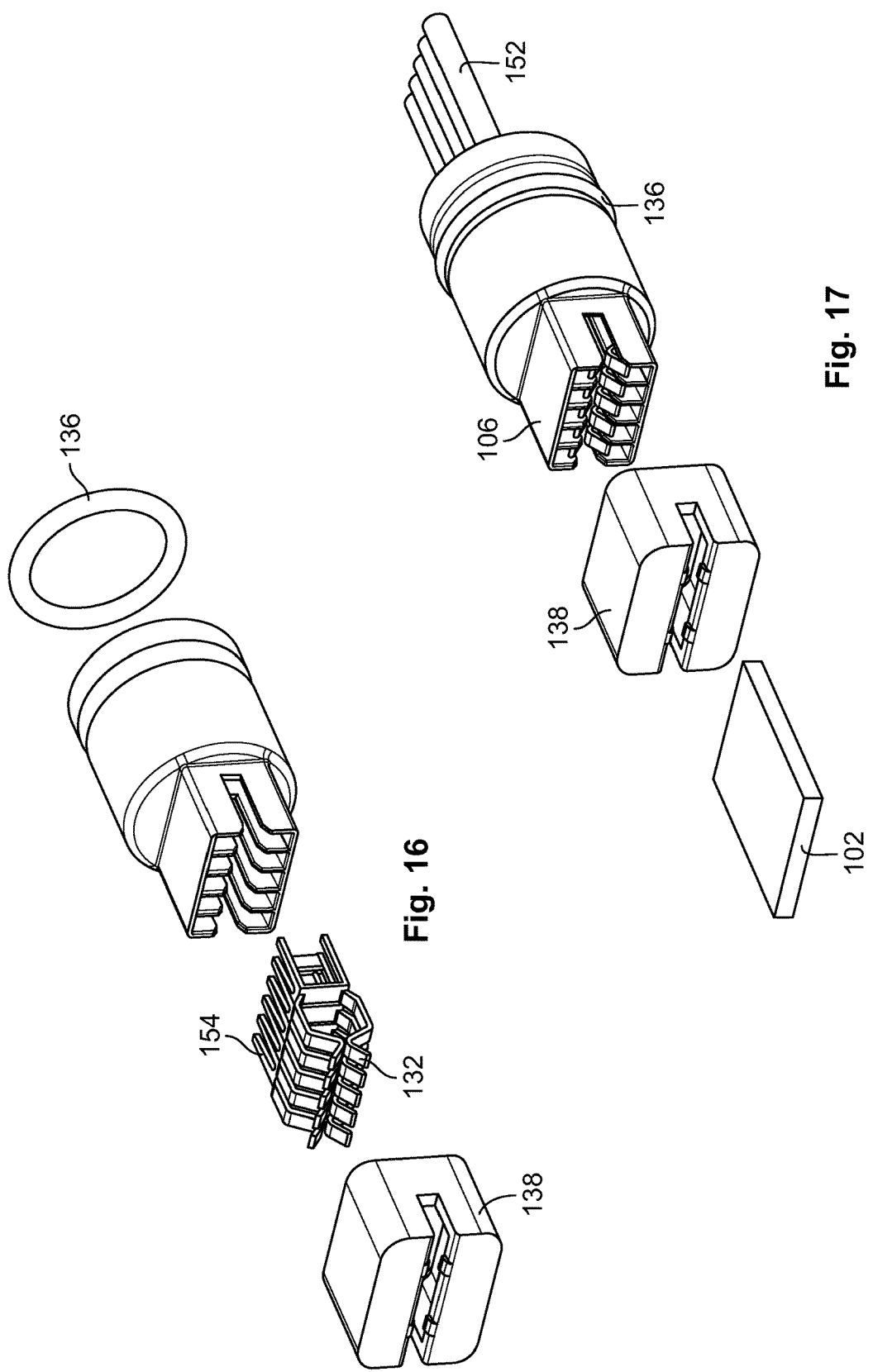

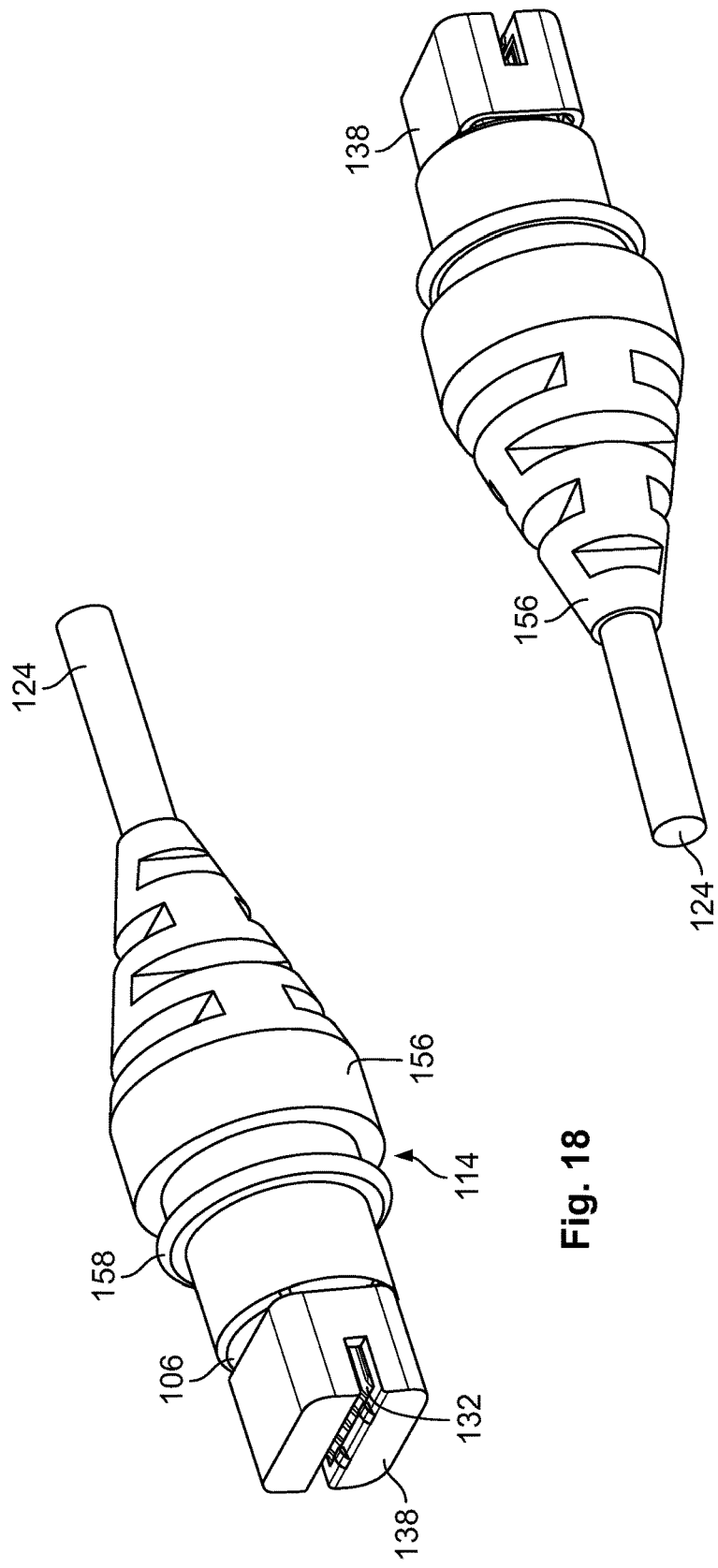

ELECTRICAL CONNECTOR, ELECTRONIC COMPONENT, AND ASSEMBLY METHOD

CROSS-REFERENCE TO RELATED APPLICATIONS

This application is a continuation of PCT International Application No. PCT/EP2016/055382, filed on Mar. 11, 2016, which claims priority under 35 U.S.C. § 119 to European Patent Application No. 15158971.0, filed on Mar. 13, 2015.

FIELD OF THE INVENTION

The present invention relates to an electrical connector and, more particularly, to an electrical connector for an electronic component.

BACKGROUND

Inductive proximity sensors are well known in the art and usually comprise a coil that is wound around a ferrite core to form an oscillator. The inductive proximity sensor is connected to a circuit board which is equipped with integrated circuits, for instance an electronic analyzing unit and an amplifying circuit. When a metallic object approaches the sensor, the oscillator is detuned and thus a signal in response to the approaching object is generated. All components of the sensor are integrated within an elongated housing. The sensor coil is arranged at a front end of the sensor and a peripheral contact element for connecting the sensor to external electronic components, such as a plug connector or an electrical lead, is arranged at the opposing back end of the sensor. A circuit carrier, usually a printed circuit board (PCB), carries the sensor electronics and is electrically connected to the peripheral contact element.

There exist different concepts in the prior art for equipping sensors using a plug connector as the peripheral contact element. A conventional plug connector can be screwed or pressed into the housing and then connected to the PCB by manually soldered electrically conductive leads. Alternatively, a flexible printed circuit board can be soldered directly to the plug connector. In a further alternative, a conventional plug connector can be assembled with a cable and an edge connector which is connected to the PCB; this variant, however, requires considerable space. It is further known to directly assemble the plug connector on the PCB and mount the PCB with the plug connector in the housing such that the plug connector remains accessible via a suitable opening in the housing. According to a further conventional arrangement, a plurality of contact pins are assembled individually on the PCB and allowed to extend to the outside through a respective support structure in the housing. Finally, it is known to overmold a plug connector at the housing and contact the PCB using a lead frame which is pressed-in or soldered to the PCB.

Some applications of inductive proximity sensors require that the sensor is equipped with a cable of a suitable length as the peripheral contact element instead of a plug connector. Such a cable can be soldered manually to the printed circuit board. Alternatively, the cable can be provided with an edge connector. Conventional cable connections achieve a sealed encapsulation of the sensor components as well as the necessary strain relief by providing an additional overmolding step. Alternatively, a cable gland is often used for providing sealing and strain relief.

Inductive proximity sensors are fabricated in mass production and therefore the assembly of the proximity sensor must be simple and cost-efficient; it is most simple and cost-efficient to require the choice of a particular peripheral contact element as late as possible in the fabrication process and to avoid manual soldering.

SUMMARY

An electrical connector according to the invention comprises an interface element attachable to a circuit board and a plurality of peripheral connectors. The interface element has an inner contact electrically contacting the circuit board and a connecting interface. The peripheral connectors are each individually matable with the connecting interface. The peripheral connectors include a peripheral plug connector having a plurality of plug connector pins and a peripheral lead connector having a plurality of wires.

BRIEF DESCRIPTION OF THE DRAWINGS

The invention will now be described by way of example with reference to the accompanying figures, of which:

FIG. 1 is a sectional view of an electronic component according to the invention with a peripheral plug connector;

FIG. 2 is a sectional view of the electronic component of FIG. 1 with a peripheral lead connector;

FIG. 7 is perspective view of another electronic component according to the invention with a peripheral plug connector;

FIG. 8 is another perspective view of the electronic component of FIG. 7;

FIG. 9 is another perspective view of the electronic component of FIG. 7;

FIG. 10 is another perspective view of the electronic component of FIG. 7;

FIG. 16 is an exploded perspective view of the electronic component of FIG. 14;

FIG. 17 is another exploded perspective view of the electronic component of FIG. 14;

FIG. 18 is a perspective view of the electronic component of FIG. 7 with another peripheral lead connector;

FIG. 19 is another perspective view of the electronic component of FIG. 18;

DETAILED DESCRIPTION OF THE EMBODIMENT(S)

Figures 3, 4, 5:
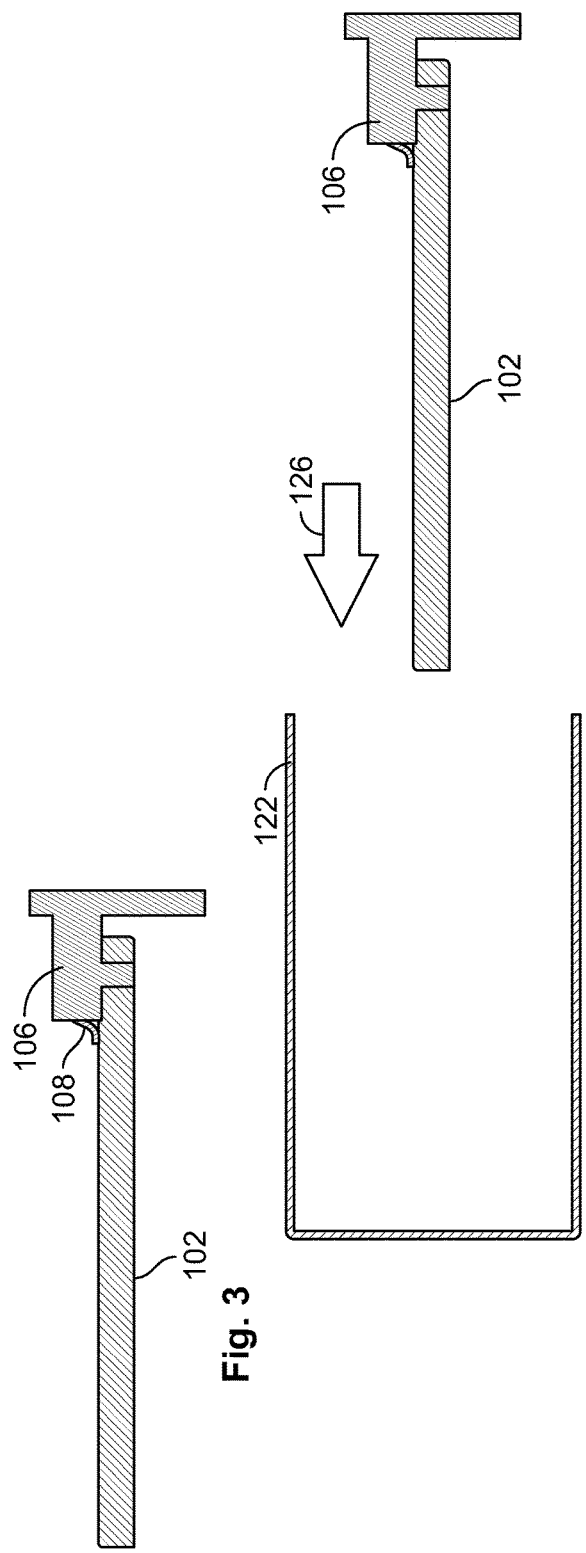
FIG. 3 is a sectional view of a first assembly step for assembling the electronic component of FIG. 1.
FIG. 4 is a sectional view of a next step for assembling the electronic component of FIG. 1.
FIG. 5 is a sectional view of a next step for assembling the electronic component of FIG. 1.

Exemplary embodiments of the present invention will be described hereinafter in detail with reference to the attached drawings, wherein like reference numerals refer to like elements. The present invention may, however, be embodied in many different forms and should not be construed as being limited to the embodiments set forth herein; rather, these embodiments are provided so that the present disclosure will be thorough and complete, and will fully convey the concept of the disclosure to those skilled in the art.

An electronic component 100 according to the invention is shown in FIGS. 1 and 2. In the shown embodiment, the electronic component 100 is a sensor. The electronic component 100 includes a circuit board 102, a housing 104, and an electrical connector 105.

The circuit board 102, as shown in FIG. 1, is a printed circuit board (PCB). The circuit board 102 carries electronic components and transducer elements, such as a sensor coil in an embodiment in which the electronic component 100 is an inductive proximity sensor.

The housing 104 encompasses the circuit board 102 and the components assembled thereon. In the embodiment shown in FIGS. 1-6, the housing 104 comprises a metal material; circuitry inside the metal housing 104 is protected against outside disturbances. The housing 104 has an elongated metal shell 122 and a plastic cap 118 received in the metal shell 122. In an embodiment, the plastic cap 118 has an outer thread 116. In an embodiment, the plastic cap 118 is injection molded.

The electrical connector 105, as shown in FIGS. 1 and 2, includes an interface element 106 and a peripheral connector 112, 114. The interface element 106 is mounted on the circuit carrier 102 and electrically connected to the circuit carrier 102 by at least one inner contact 108. In the shown embodiment, a plurality of inner contacts 108 are disposed at the interface element 106 and are each connected to a connecting interface 110. The connecting interface 110 is formed to be mated individually either with a peripheral plug connector 112 as shown in FIG. 1 or to a peripheral lead connector 114 as shown in FIG. 2. In other embodiments, the peripheral connector 112, 114 may be any alternative peripheral connector known in the art; for instance, the peripheral plug connector 112 can be formed as an M12 5-position male connector. Other peripheral connectors 112, 114 may include a wireless connection, a plug connector socket, or a pin connector.

The peripheral connector 112, 114 has a lock 120 fixing the peripheral connector 112, 114 at the interface element 106 and therefore also at the PCB 102. As shown in FIG. 1, the lock 120 is a ring-shaped or hook-shaped snap-in latch; in an embodiment, this snap-fit connection does not have to be releasable after the peripheral connector has been assembled.

The connecting interface 110 between the interface element 106 and the peripheral connector 112 or 114 is formed by a press-fit connection. The electrical connection between the interface element 106 and conductive tracks on the PCB 102 is, in an embodiment, established by reflow soldering and the interface element 106 is a surface mount device (SMD) component mounted on a surface of the PCB 102. However, in other embodiments, it is clear to one with ordinary skill in the art that other suitable known ways of contacting the PCB 102 can be used.

The electronic component 100 is shown equipped with a peripheral lead connector 114 instead of the peripheral plug connector 112 in FIG. 2. The peripheral lead connector 114 is connected to a cable 124; an opposite end of the cable 124 may carry any suitable connector for contacting an external device. The cable 124 may be a flat flexible cable, a coaxial cable, or any other electrical lead as required for contacting the external device.

A method of assembling the electronic component 100 shown in FIGS. 1 and 2 will now be described in detail with reference to FIGS. 3-6.

In a first step shown in FIG. 3, the circuit carrier 102 is attached to the interface element 106. The inner contacts 108 are connected to electrical leads on the circuit carrier 102 by, for example, reflow soldering.

In a next step shown in FIG. 4, the printed circuit board 102 with the assembled interface element 106 is inserted into the metal shell 122 in an insertion direction 126 extending along a longitudinal axis of the electronic component 100. The metal shell 122 guides and holds the PCB 102.

In a next step shown in FIG. 5, the plastic cap 118 is inserted along the insertion direction 126 within the metal shell 122.

Figure 6:
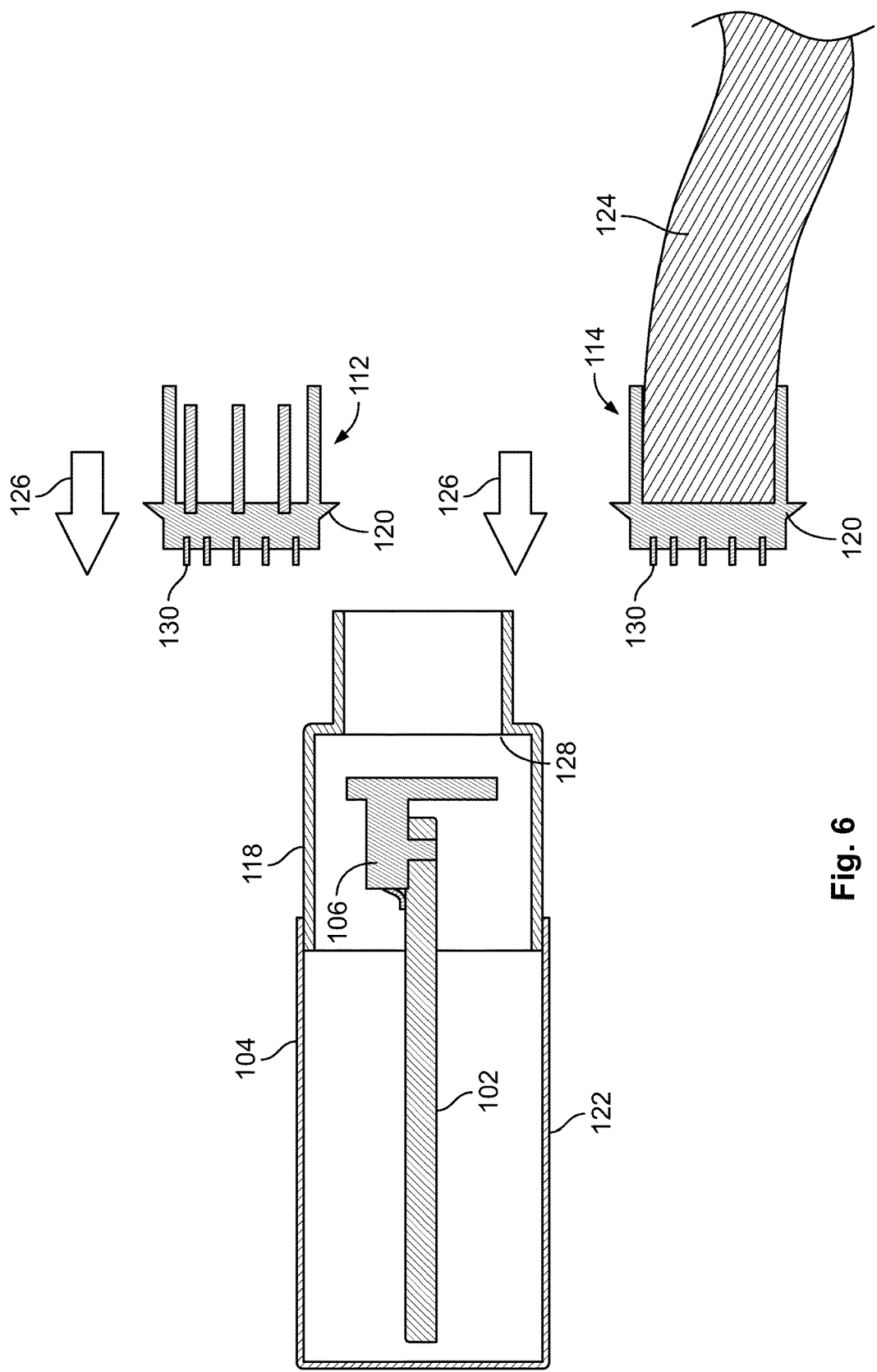
FIG. 6 is a sectional view of a next step for assembling the electronic component of FIG. 1.

FIG. 6 shows the point in the assembly procedure when it is determined whether the electronic component 100 is equipped with the peripheral plug connector 112 or with the peripheral lead connector 114; either the plug connector 112 or the lead connector 114 described above can be attached to the interface element 106. The chosen peripheral connector 112, 114 is inserted along the insertion direction 126 into the plastic cap 118. The lock 120 engages a circumferential shoulder 128 at the plastic cap 118 in an essentially irreversible manner. The peripheral connectors 112, 114 have press-fit contacts 130 that connect the respective peripheral connector 112, 114 to the connecting interface 110 of the interface element 106. In other embodiment, spring contacts can be used instead of the press-fit contacts 130. The connection between the respective peripheral connector 112, 114 and the plastic end cap 118 can be designed in a way that the housing 104 is closed in a watertight and dustproof manner.

An electrical component according to another embodiment of the invention is shown in FIGS. 7-20. Like reference numbers indicate like elements and only the differences with respect to the embodiment of FIGS. 1-6 will be described in detail. The embodiment of FIGS. 7-20 differs from the embodiment of FIGS. 1-6 in that an interface element 106 is first connected to each of the peripheral connectors 112, 114, and that the connection between the interface element 106 and the circuit carrier 102 is established in the same step when assembling the peripheral connectors 112, 114.

A peripheral plug connector 112 with an attached interface element 106 is shown in FIGS. 7-10. The interface element 106 engages the PCB 102 in a clamping manner. The interface element 106 has spring contacts 132 contacting contact areas of the PCB 102. The spring contacts 132 are pushed over the printed circuit board 102 and establish an electrical contact due to the spring forces of the contact 132. These forces are primarily perpendicular to the insertion direction 126. However, when overmolding the PCB 102 by filling a cast resin into the housing 104, electrically insulating material can enter between the spring contacts 132 and the printed circuit board 102, deteriorating the quality of the electrical contact. Consequently, the interface element 106 has a cover 138 for protecting the spring contacts 132 against the ingress of the cast resin. The cover 138 is fabricated from an elastic material so that it is in tight contact with the PCB 102 before the cast resin is filled in.

A snap-fit projection 134, as shown in FIGS. 7, 8, and 10, is formed at the outside of the peripheral plug connector 112 for engaging with a corresponding recess or shoulder provided at the housing 104. A ring-shaped gasket 136 seals the mechanical interface between the housing 104 and the inserted peripheral plug connector 112 in a final mounted state.

Figure 11:
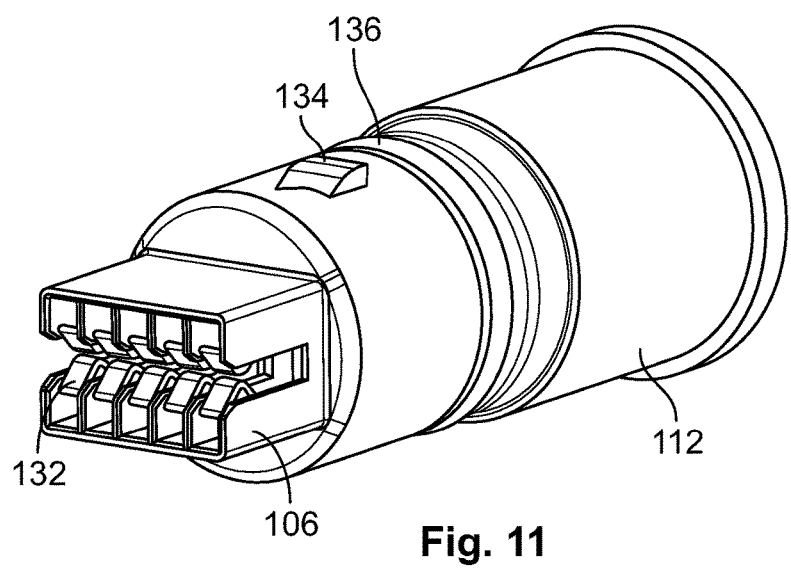
FIG. 11 is another perspective view of the electronic component of FIG. 7 without a protective cover.
Figure 12:
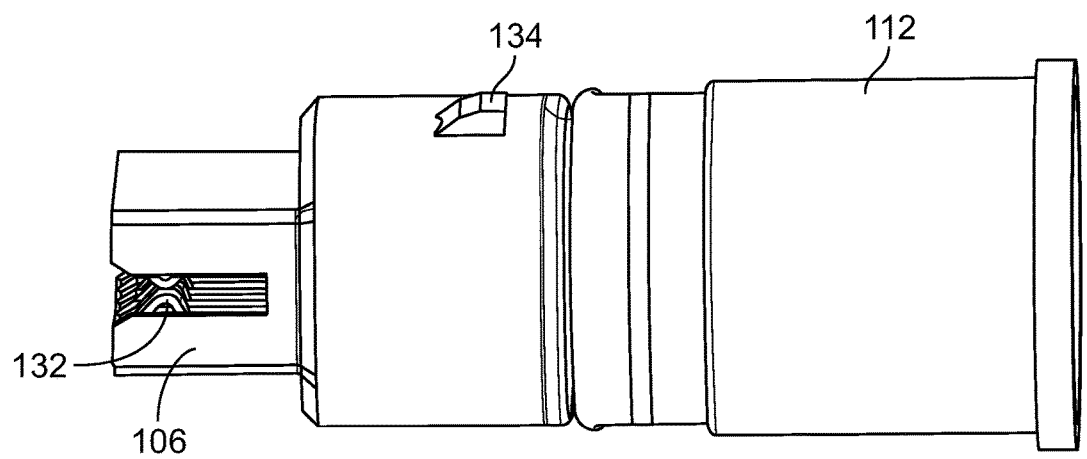
FIG. 12 is a side view of the electronic component of FIG. 11.
Figure 13:
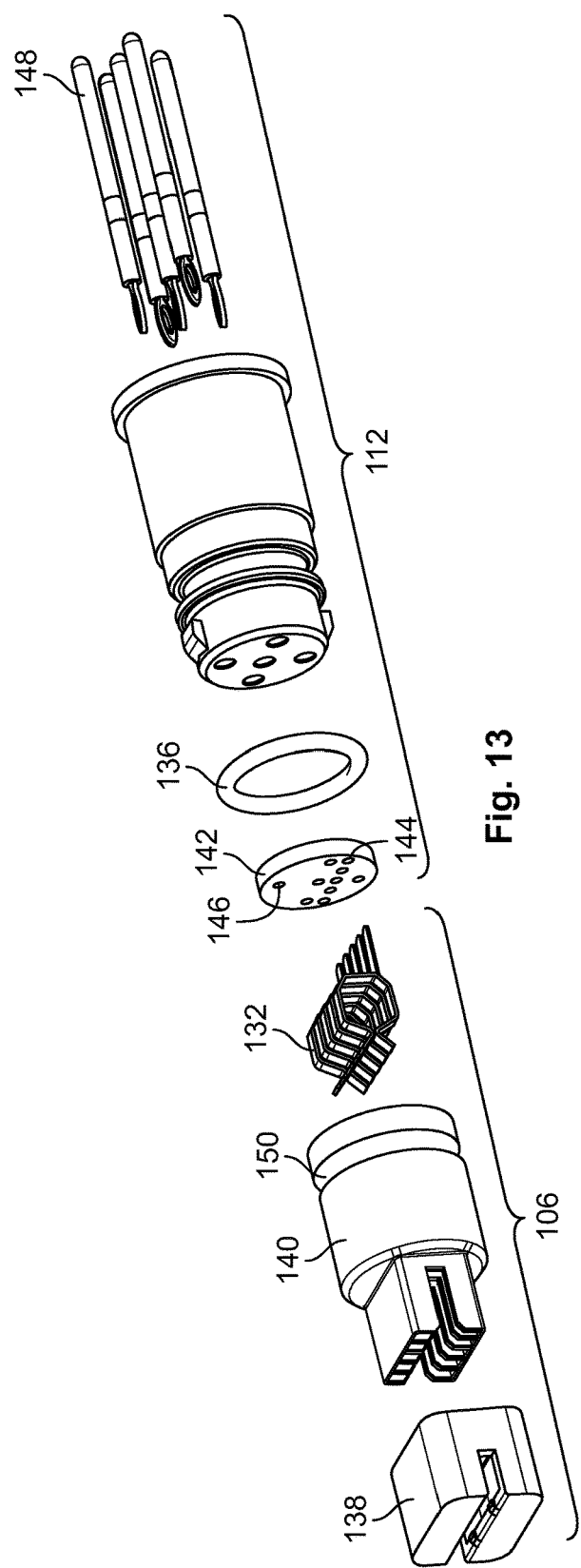
FIG. 13 is an exploded perspective view of the electronic component of FIG. 7.
Figure 14:
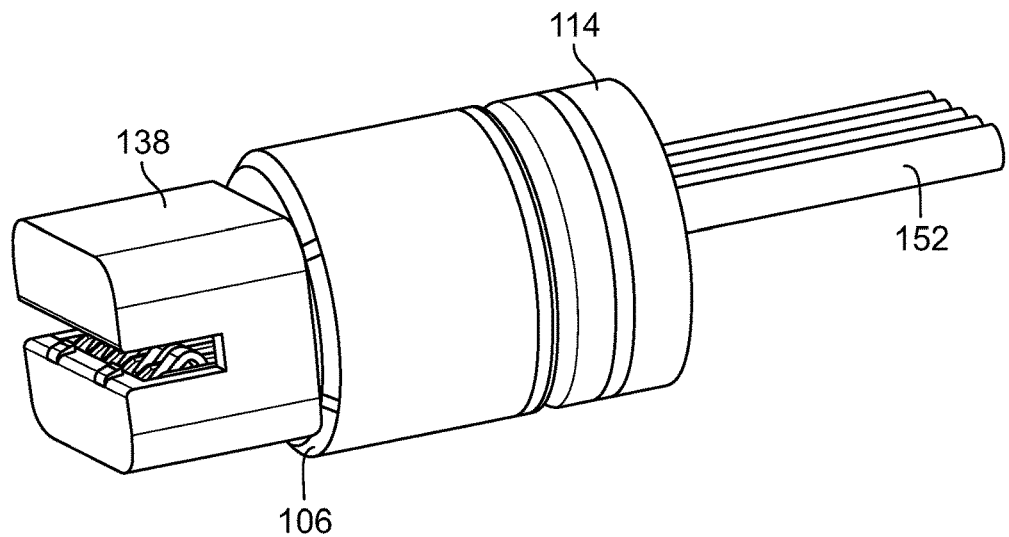
FIG. 14 is a perspective view of the electronic component of FIG. 7 with a peripheral lead connector.
Figure 15:
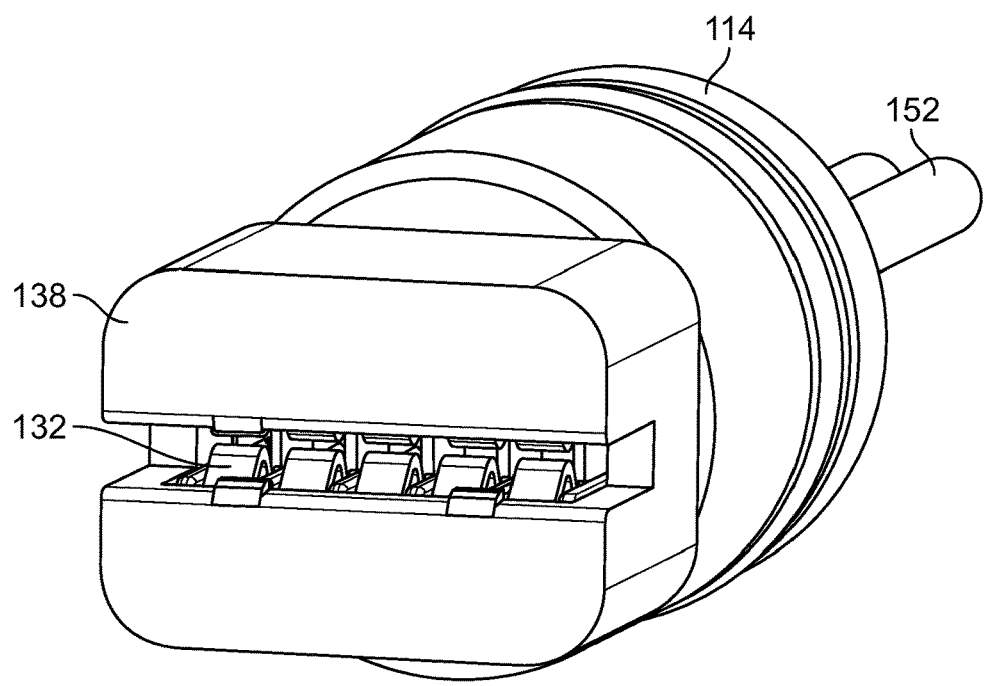
FIG. 15 is another perspective view of the electronic component of FIG. 14.

As shown in FIGS. 11-13, the interface element 106 comprises the spring contacts 132 which are assembled in a contact carrier 140. In order to form a connecting interface 110 between the interface element 106 and the peripheral plug connector 112, the spring contacts 132 are connected to an intermediate circuit board 142. The intermediate circuit board 142 has a first plurality of metallized contact openings 144 for receiving the spring contacts 132. The intermediate circuit board 142 has a second plurality of metallized contact openings 146 which receive a plurality of plug connector pins 148 of the peripheral plug connector 112. Conducting paths are provided in the intermediate circuit board 142 which interconnect the contact openings 144, 146 and thereby electrically connect the spring contacts 132 with the plug connector pins 148. The gasket 136, disposed in a groove 150, seals the interface between the housing 104 and the interface element 106.

A lead connector 114 of the electrical component in the embodiment of FIGS. 7-20, as an alternative to the plug connector 112, is shown in FIGS. 14-17. An interface of the lead connector 114 towards the PCB 102 has spring contacts 132 that contact the PCB 102 by clamping it from two sides at the edge. An elastic protective cover 138 is provided for preventing casting resin drawn by capillary forces into the minute gap between the PCB 102 and the spring contacts 132 as described above. In contrast to the peripheral plug connector 112 shown in FIGS. 7 to 13, the peripheral lead connector 114 comprises a plurality of electrically insulated wires 152 with a conductive core. The wires 152 may either be attached to the peripheral lead connector 114 as single leads or may form a ribbon cable. Although an arrangement with an intermediate circuit board 142 as shown in FIG. 13 may also be used for fabricating the peripheral lead connector 114 of FIGS. 14 and 15, it is even more efficient to directly connect the wires 152 to the spring contacts 132; this embodiment is shown in FIGS. 16 and 17. The spring contacts 132 have insulation displacement terminations 154 for cutting the insulation of the wires 152 and electrically contacting the conductive cores of the wires 152.

Figure 20:
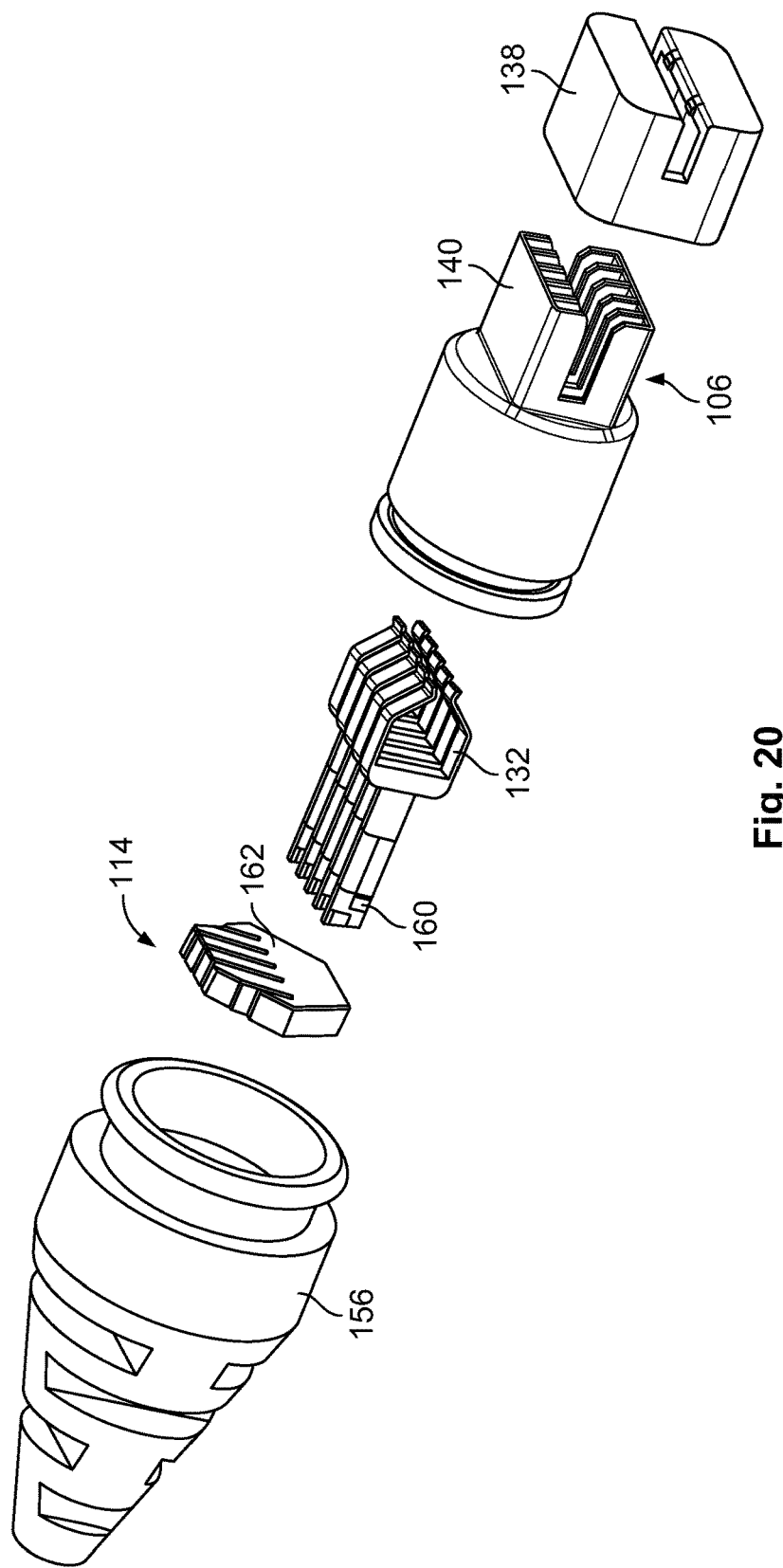
FIG. 20 is an exploded perspective view of the electronic component of FIG. 18.
Figure 22:
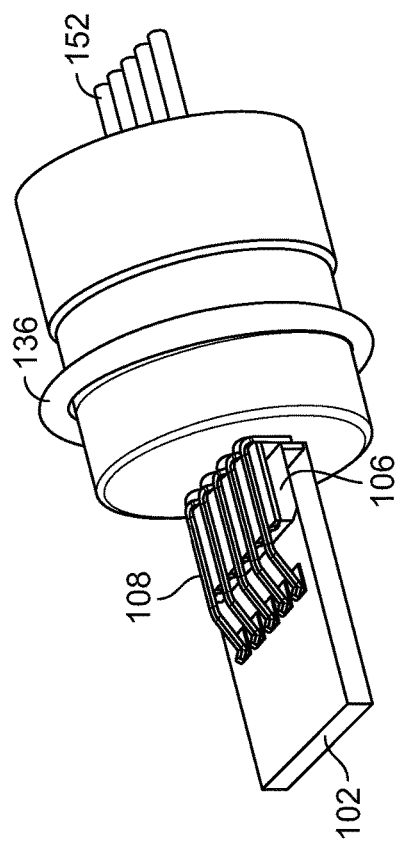
FIG. 22 is another perspective view of the electronic component of FIG. 21.
Figure 23:
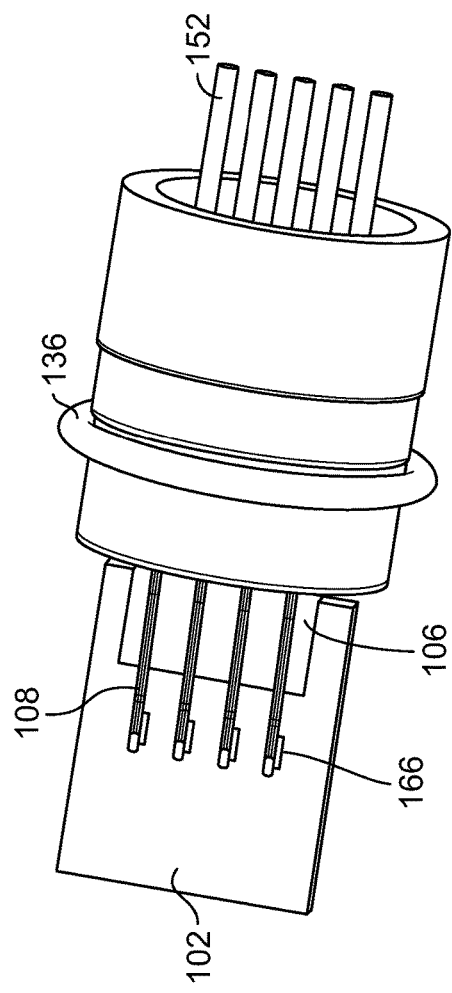
FIG. 23 is another perspective view of the electronic component of FIG. 21.

A further peripheral lead connector 114 with an attached interface element 106 is shown in FIGS. 18-20. According to this embodiment, the outgoing cable 124 is protected by a tension relief 156. The tension relief 156 is formed of an elastic material and comprises a sealing rim 158 which can replace the gasket 136. As shown in FIG. 20, the spring contacts 132 have crimp regions 160 for attaching the individual wires of the cable 124. The ends of the wires are first stripped from their insulation and then crimped individually to one spring contact 132 each. The spring contacts 132 are then arranged in a holder 162 and inserted into the contact carrier 140. Next, the protective cover 138 and the tension release 156 are attached.

Figure 27:
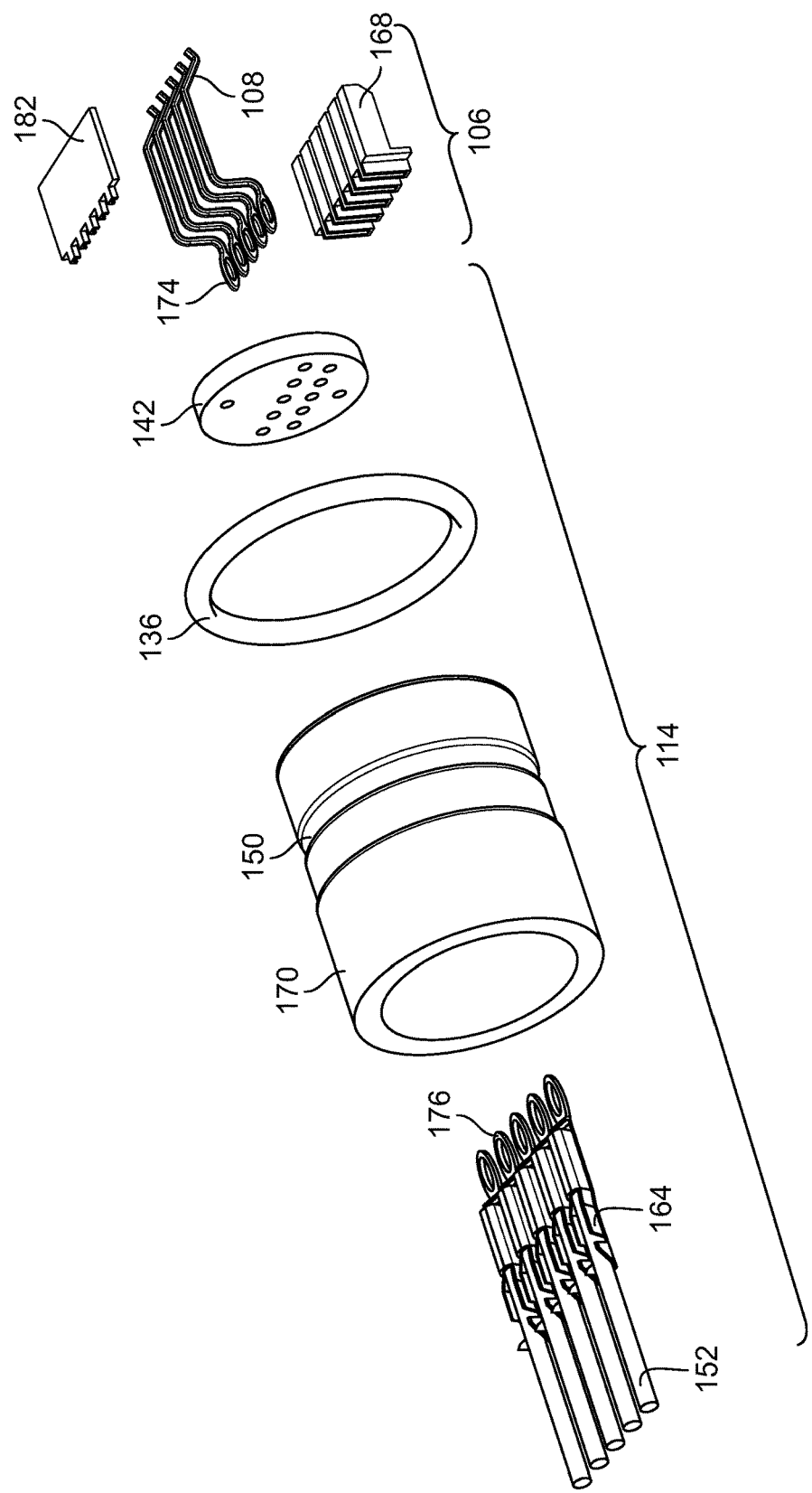
FIG. 27 is an exploded perspective view of the electronic component of FIG. 21.
Figure 28:
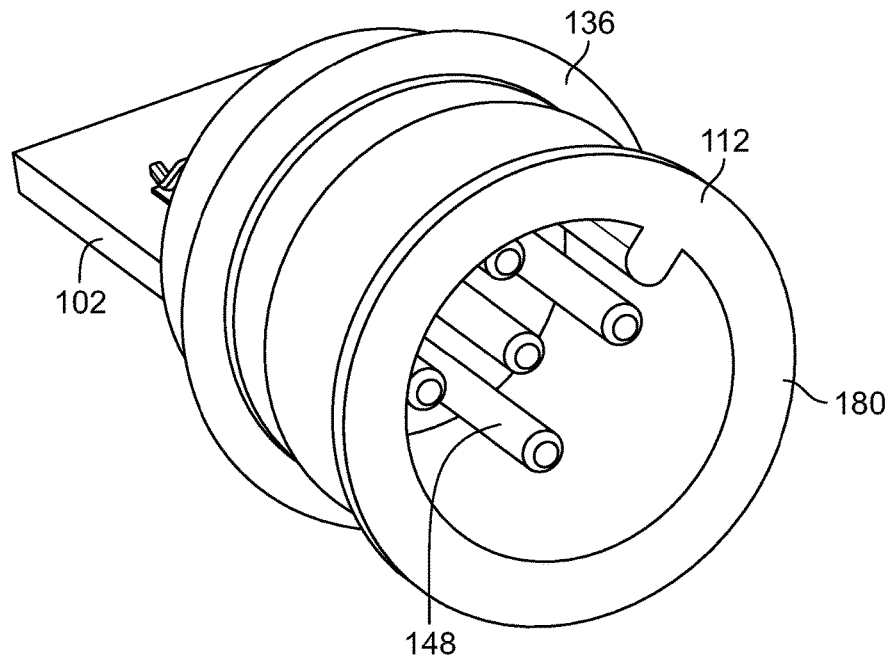
FIG. 28 is a perspective view of the electronic component of FIG. 21 with a peripheral plug connector.
Figure 29:
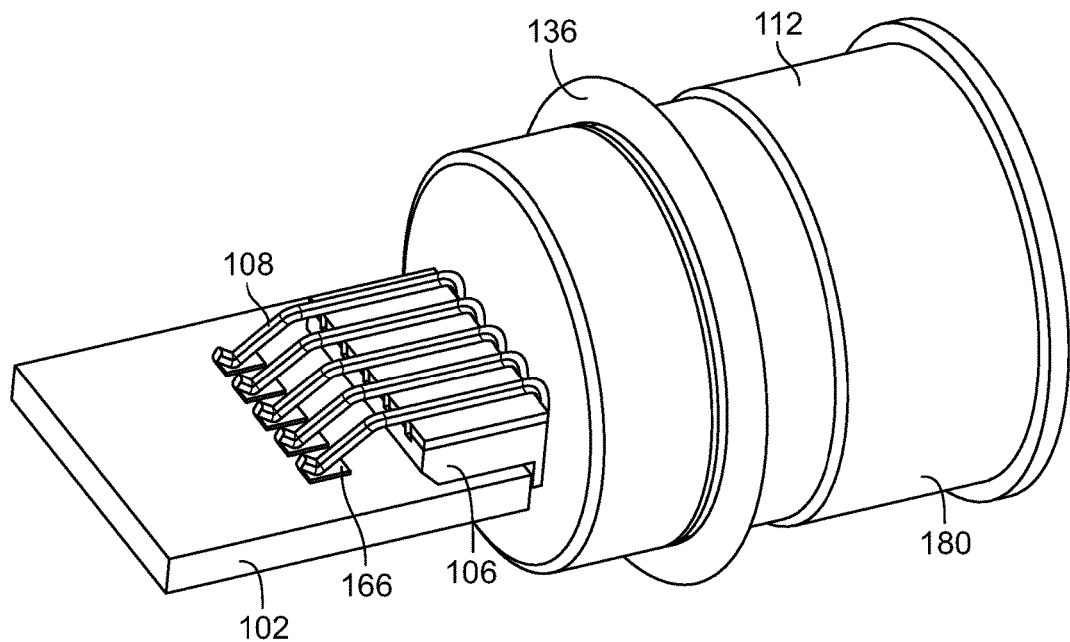
FIG. 29 is another perspective view of the electronic component of FIG. 28.
Figure 30:
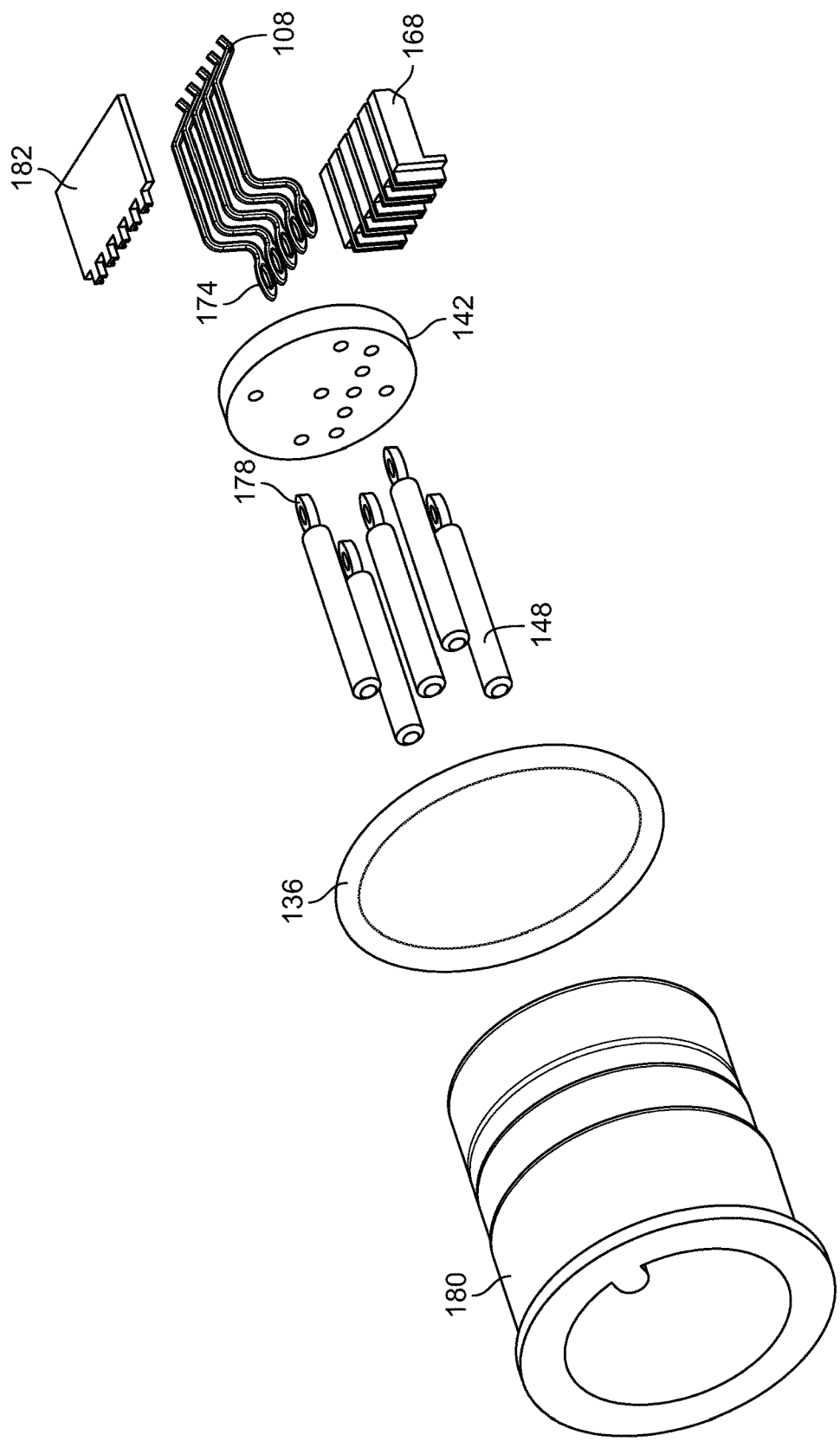
FIG. 30 is an exploded perspective view of the electronic component of FIG. 28
Figure 32:
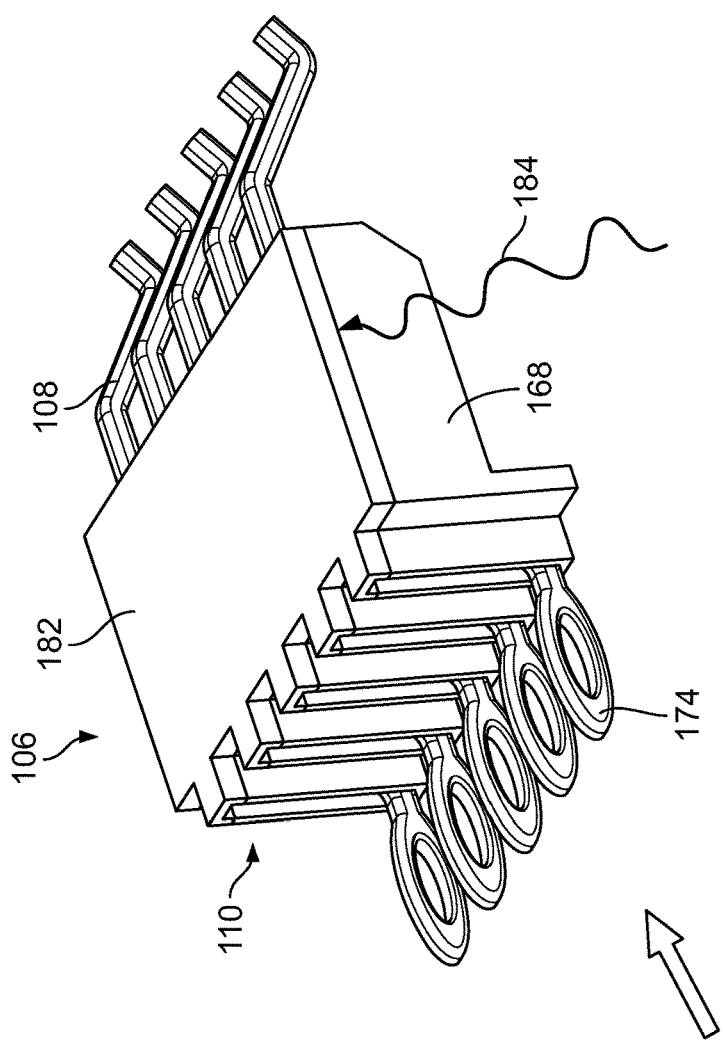
FIG. 32 is a perspective view of a final step of fabricating the interface element of FIG. 25.
Figure 31:
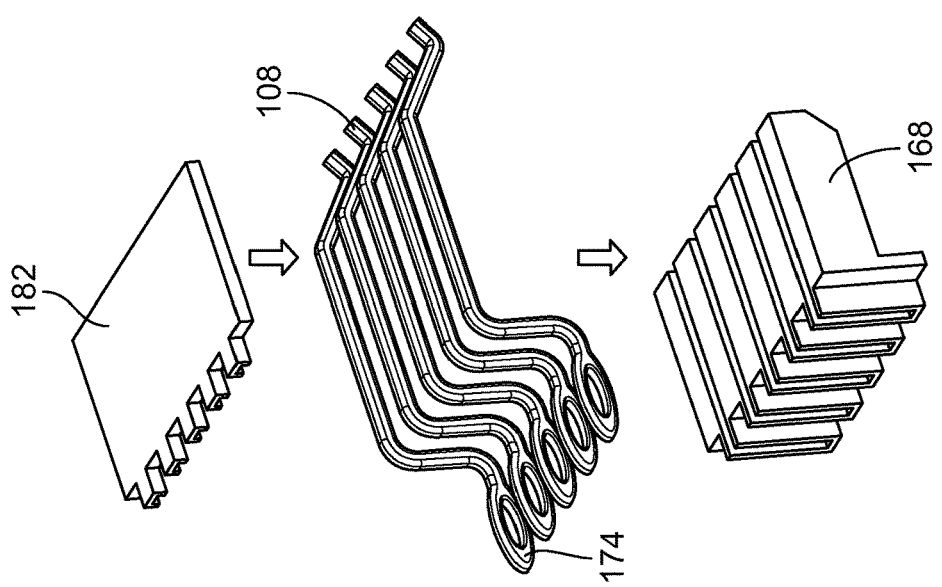
FIG. 31 is a perspective view of a first step of fabricating the interface element of FIG. 25.

An electrical component according to another embodiment of the invention is shown in FIGS. 21-32. FIGS. 21-27 show the peripheral lead connector 114 whereas FIGS. 28-30 show the corresponding peripheral plug connector 112. FIGS. 31 and 32 illustrate the assembly of the interface element 106.

Figure 21:
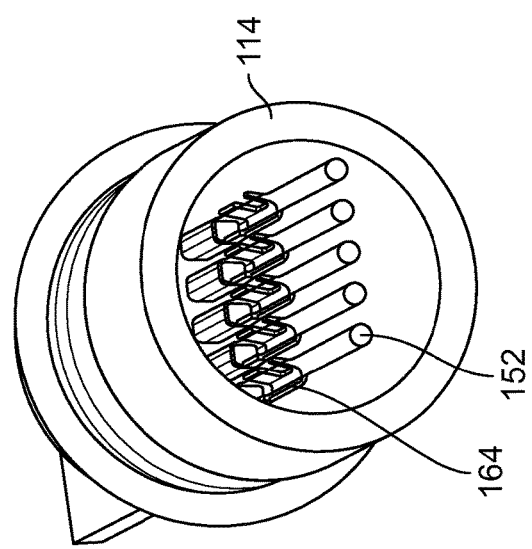
FIG. 21 is a perspective view of an electronic component according to another embodiment of the invention.
Figure 25:
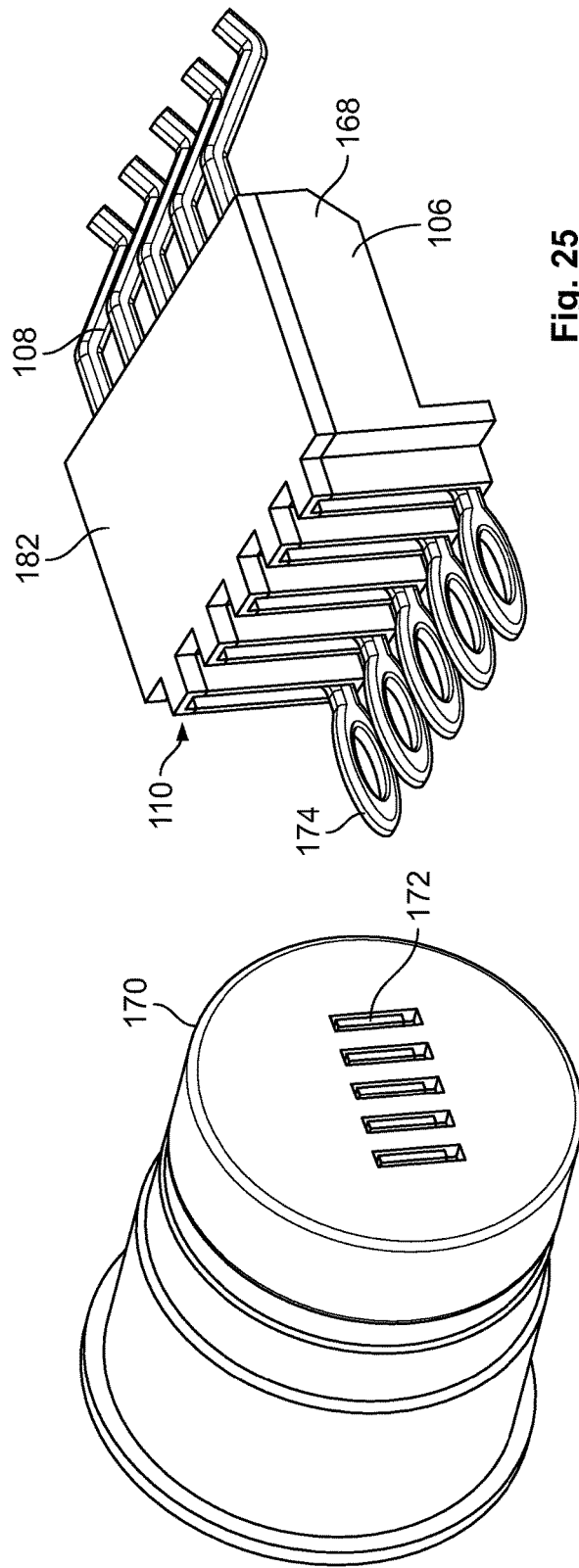
FIG. 25 is a perspective view of an interface element of the electronic component of FIG. 21 connectable with the housing of FIG. 24.
Figure 26:
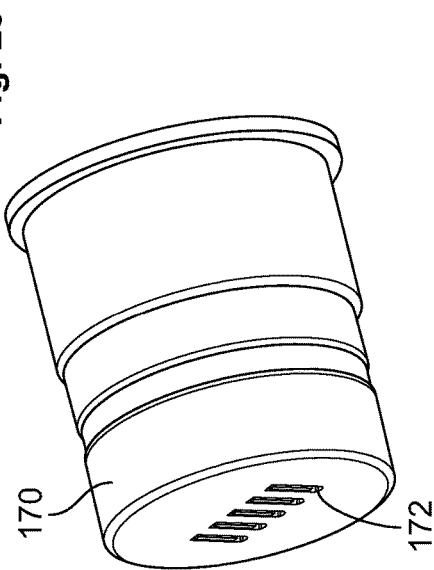
FIG. 26 is a perspective view of the housing of FIG. 24 and the interface element of FIG. 25.
Figure 24:
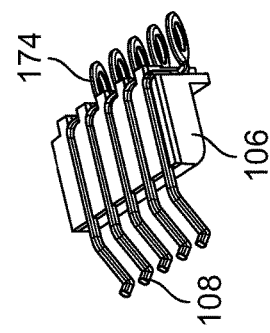
FIG. 24 is a perspective view of a housing of the electronic component of FIG. 21.

As shown in FIG. 21, the wires 152 are attached by crimp connections 164 to the peripheral lead connector 114. The interface element 106 comprises inner contacts 108 that are soldered to a plurality of respective contact pads 166 at the PCB 102. The interface element 106, as shown in FIG. 25, comprises an electrically insulating body 168 and a plurality of inner contacts 108 that provide a connecting interface 110 for the peripheral plug connector 112. An electrically insulating housing 170 of the peripheral lead connector 114 has receptacles 172 through which contacts 174 can be inserted.

The interface element 106 contacts the peripheral lead connector 114 with the contacts 174, as shown in FIG. 27. An intermediate circuit board 142 is provided within the housing 170 of the peripheral connector 114. Wires 152 are fixed by crimp connections 164 to further contacts 176. After the interface element 106 is soldered to the PCB 102, the PCB 102 is mounted in the housing 104. The peripheral lead connector 114 is assembled by attaching the wires 152 at the intermediate circuit board 142 contained within the housing 170. Finally, the peripheral lead connector 114 is connected to the contacts 174 by inserting the lead connector 114 partly into the housing 104.

The corresponding peripheral plug connector 112 is shown in FIGS. 28-30. The construction of the plug connector 112 is similar to the design of the lead connector 114, with the exception that the housing 180 is formed to hold plug connector pins 148 which are connected to an intermediate circuit board 142 by contacts 178. The connector housing 180 of the peripheral connector 112 has identical receptacles 172 for receiving the contacts 174 of the interface element 106. A suitable wiring provided within the intermediate circuit board 142 provides the connection between the inner contacts 108 and the pins 148.

The interface element 106 is shown in greater detail in FIGS. 31 and 32. The interface element 106 has solderable inner contacts 108 and contacts 174 at the connecting interface 110.

The contacts 174 are monolithically formed with the inner contacts 108. These contacts 108, 174 are then arranged in an electrically insulating body 182. A cover 182 is mounted on the body 168 in order to fix the contact 108, 174 at the body 168 and an ultrasonic welding step (illustrated by the arrow 184) connects the cover 182 to the body 168.

What is claimed is:

1. An electrical connector, comprising:
an interface element having a plurality of electrically conductive spring contacts releasably clamping and electrically contacting a printed circuit board and a connecting interface having an intermediate circuit board, an end of each of the spring contacts opposite the printed circuit board is disposed in one of a first plurality of metallized contact openings of the intermediate circuit board; and
a plurality of peripheral connectors each individually electrically connectable to the connecting interface at a second plurality of metallized contact openings of the intermediate circuit board, the peripheral connectors including a peripheral plug connector having a plurality of plug connector pins and a peripheral lead connector having a plurality of wires.

2. The electrical connector of claim 1, wherein the interface element is separate from the peripheral connectors.

3. The electrical connector of claim 1, wherein each of the peripheral connectors has a lock fixing the peripheral connector at the interface element.

4. The electrical connector of claim 1, wherein the interface element and each of the peripheral connectors are connectable by a press-fit connection.

5. The electrical connector of claim 1, wherein the interface element is mounted to a surface of the circuit board by reflow soldering.

6. The electrical connector of claim 1, wherein the interface element has a cover protecting the spring contacts.

7. An electronic component, comprising:
a printed circuit board;
an interface element having a plurality of electrically conductive spring contacts releasably clamping and electrically contacting the printed circuit board and a connecting interface having an intermediate circuit board, an end of each of the spring contacts opposite the printed circuit board is disposed in one of a first plurality of metallized contact openings of the intermediate circuit board; and
a plurality of peripheral connectors each individually electrically connectable to the connecting interface at a second plurality of metallized contact openings of the intermediate circuit board, the peripheral connectors including a peripheral plug connector having a plurality of plug connector pins and a peripheral lead connector having a plurality of wires.

8. The electronic component of claim 7, further comprising a housing at least partly encompassing the circuit board.

9. The electronic component of claim 8, wherein each of the peripheral connectors has a lock engaging the housing and fixing the peripheral connector at the interface element.

10. The electronic component of claim 9, wherein each of the peripheral connectors encloses the housing.

11. The electronic component of claim 10, wherein the housing includes an elongated cylindrical shell and a cap received in the shell, the cap receiving the peripheral connectors.

12. The electronic component of claim 11, wherein the shell is formed of a metal material and the cap is formed of a plastic material.

* * * * *